United States Patent
Han et al.

(10) Patent No.: US 10,380,055 B2
(45) Date of Patent: Aug. 13, 2019

(54) MEMORY CARD HAVING MULTI-ROW TERMINALS

(71) Applicant: Samsung Electronics Co., Ltd., Suwon-si, Gyeonggi-do (KR)

(72) Inventors: Seok-jae Han, Seongnam-si (KR); Gwang-man Lim, Seoul (KR); Il-mok Kang, Suwon-si (KR); Sang-chul Kang, Hwaseong-si (KR); Seok-cheon Kwon, Yongin-si (KR); Seok-chan Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/322,987

(22) PCT Filed: Jun. 30, 2015

(86) PCT No.: PCT/KR2015/006695
§ 371 (c)(1),
(2) Date: Dec. 29, 2016

(87) PCT Pub. No.: WO2016/003155
PCT Pub. Date: Jan. 7, 2016

(65) Prior Publication Data
US 2017/0154003 A1   Jun. 1, 2017

(30) Foreign Application Priority Data
Jun. 30, 2014 (KR) .................. 10-2014-0081215

(51) Int. Cl.
*G06F 13/12* (2006.01)
*G06F 13/40* (2006.01)
(Continued)

(52) U.S. Cl.
CPC ...... *G06F 13/4068* (2013.01); *G06F 13/1668* (2013.01); *G06K 13/08* (2013.01);
(Continued)

(58) Field of Classification Search
CPC ............ H01L 2924/00; H01L 2924/12; H01L 2924/14; H01L 2224/0239; H01L 2224/48227; G06F 3/00
(Continued)

(56) References Cited

U.S. PATENT DOCUMENTS

D492,688 S    7/2004  Wallace et al.
6,939,182 B1  9/2005  Wen et al.
(Continued)

FOREIGN PATENT DOCUMENTS

CN    1610194      4/2005
CN    101334831    12/2008
(Continued)

OTHER PUBLICATIONS

International Search Report and the Written Opinion of the International Searching Authority in corresponding PCT Application No. PCT/KR2015/006695 dated Sep. 10, 2015, 14 pages.

*Primary Examiner* — Titus Wong
(74) *Attorney, Agent, or Firm* — Myers Bigel, P.A.

(57) ABSTRACT

Provided is a memory card, which includes two pairs of opposite edges, first row terminals arranged adjacent to an insertion-side edge of the memory card, and second row terminals arranged apart from the insertion-side edge of the memory card. The memory card can be easily reset in terms of software without controlling power supply in terms of hardware. Also, the memory card can be smoothly attached and detached during insertion of the memory card into a socket and reduce damage to a device.

20 Claims, 11 Drawing Sheets

(51) Int. Cl.
  *G06K 13/08* (2006.01)
  *G06K 19/077* (2006.01)
  *G06F 13/16* (2006.01)
  *G11C 5/14* (2006.01)
(52) U.S. Cl.
  CPC . *G06K 19/07732* (2013.01); *G06K 19/07743* (2013.01); *G11C 5/14* (2013.01)
(58) Field of Classification Search
  USPC .................................................. 710/305, 15
  See application file for complete search history.

(56) References Cited

U.S. PATENT DOCUMENTS

| | | |
|---|---|---|
| 7,114,993 B2 | 10/2006 | Chen |
| 7,291,903 B2 | 11/2007 | Nishizawa et al. |
| 7,306,160 B2 | 12/2007 | Takiar et al. |
| 7,306,161 B2 | 12/2007 | Takiar et al. |
| 7,516,903 B2 | 4/2009 | Nishizawa et al. |
| 7,552,876 B2 | 6/2009 | Nishizawa et al. |
| 7,862,381 B2 | 1/2011 | Miller |
| 7,864,540 B2 | 1/2011 | Takiar |
| 7,946,500 B2 | 5/2011 | Nishizawa et al. |
| 7,989,960 B2 | 8/2011 | Shinohara et al. |
| 8,167,659 B2 | 5/2012 | Miller |
| 8,274,141 B2 | 9/2012 | Nishiyama et al. |
| 8,319,275 B2 | 11/2012 | Shim et al. |
| 8,337,252 B2 | 12/2012 | Mambakkam et al. |
| 8,456,850 B2 | 6/2013 | Kang et al. |
| 8,867,215 B2 | 10/2014 | Kang et al. |
| 8,995,118 B2 | 3/2015 | Kang et al. |
| 9,048,557 B2 | 6/2015 | Kang et al. |
| 2004/0059846 A1* | 3/2004 | Liu ...................... G06K 19/077 710/62 |
| 2004/0199721 A1* | 10/2004 | Chen ...................... G06K 19/077 711/115 |
| 2006/0014436 A1 | 1/2006 | Wu |
| 2006/0112197 A1* | 5/2006 | Yao ........................ G06F 13/409 710/15 |
| 2006/0288145 A1* | 12/2006 | Chen ............... H05K 5/0282 710/301 |
| 2008/0025003 A1 | 1/2008 | Nishizawa et al. |
| 2008/0049392 A1 | 2/2008 | Takiar |
| 2008/0173995 A1 | 7/2008 | Kuratomi et al. |
| 2008/0283619 A1 | 11/2008 | Nishizawa et al. |
| 2010/0312965 A1 | 12/2010 | Cooke et al. |
| 2011/0040918 A1* | 2/2011 | Pinto ..................... G06F 13/409 710/301 |
| 2011/0134620 A1 | 6/2011 | Kang et al. |
| 2011/0145465 A1 | 6/2011 | Okada |
| 2012/0117315 A1 | 5/2012 | Okada |
| 2013/0012049 A1 | 1/2013 | Pinto et al. |
| 2013/0102170 A1 | 4/2013 | Yang et al. |
| 2013/0242499 A1 | 9/2013 | Kang et al. |
| 2014/0051353 A1* | 2/2014 | Nakamura ........... H04B 5/0031 455/41.1 |
| 2014/0226279 A1 | 8/2014 | Kang et al. |
| 2014/0258563 A1* | 9/2014 | Otsuka .................. G06F 13/385 710/13 |
| 2014/0328017 A1 | 11/2014 | Kang et al. |
| 2014/0342588 A1 | 11/2014 | Kang et al. |
| 2015/0143022 A1* | 5/2015 | Shacham ............ G06F 12/0246 711/103 |

FOREIGN PATENT DOCUMENTS

| | | |
|---|---|---|
| CN | 101504939 | 8/2009 |
| CN | 101814508 | 8/2010 |
| KR | 10-2011-0065249 | 6/2011 |

* cited by examiner

[Fig. 1]
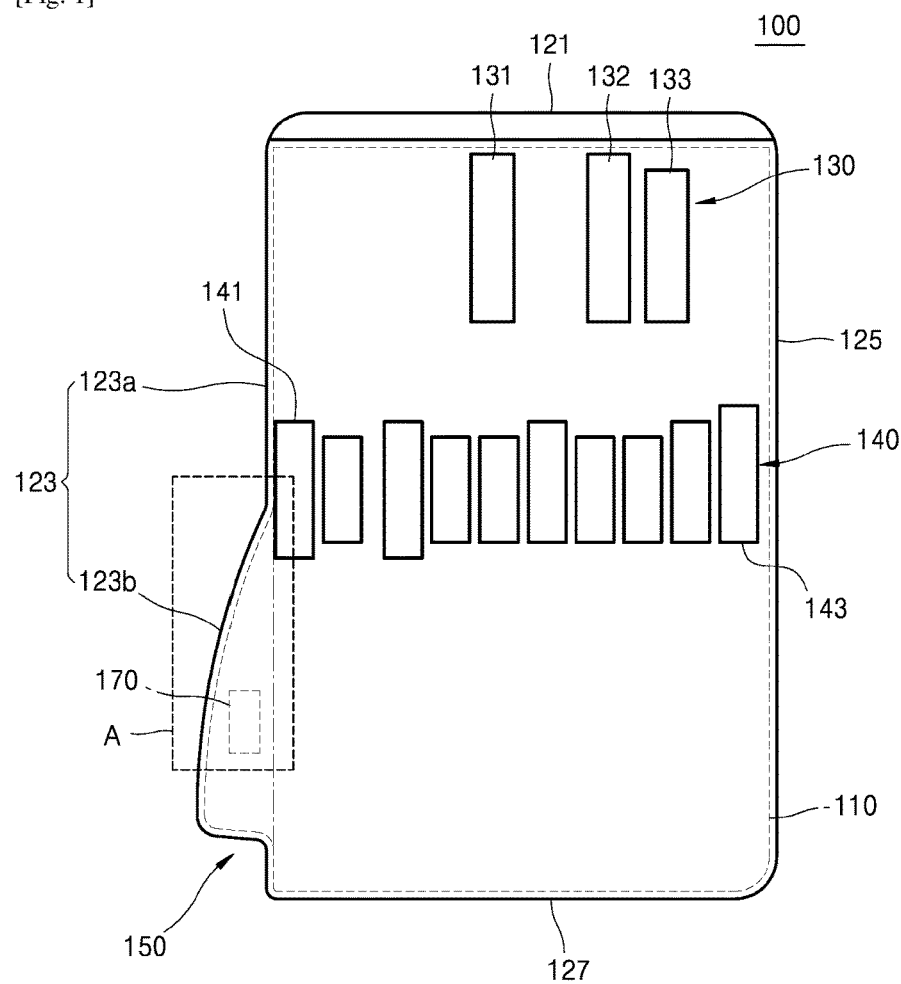
[Fig. 2]
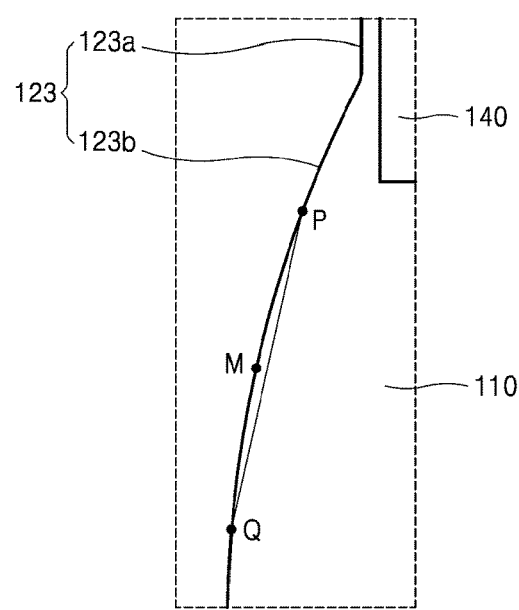

[Fig. 3]
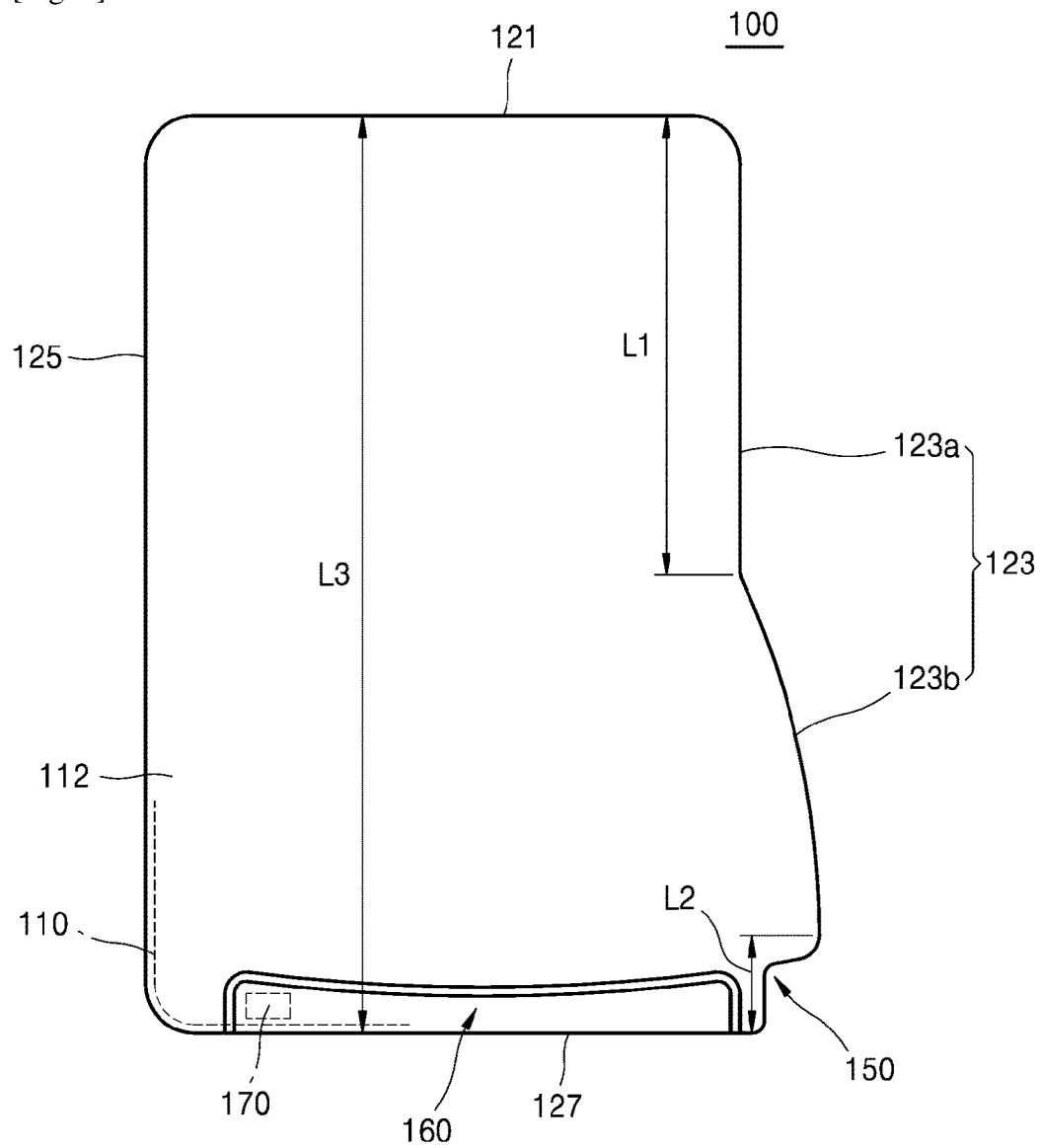

[Fig. 4]
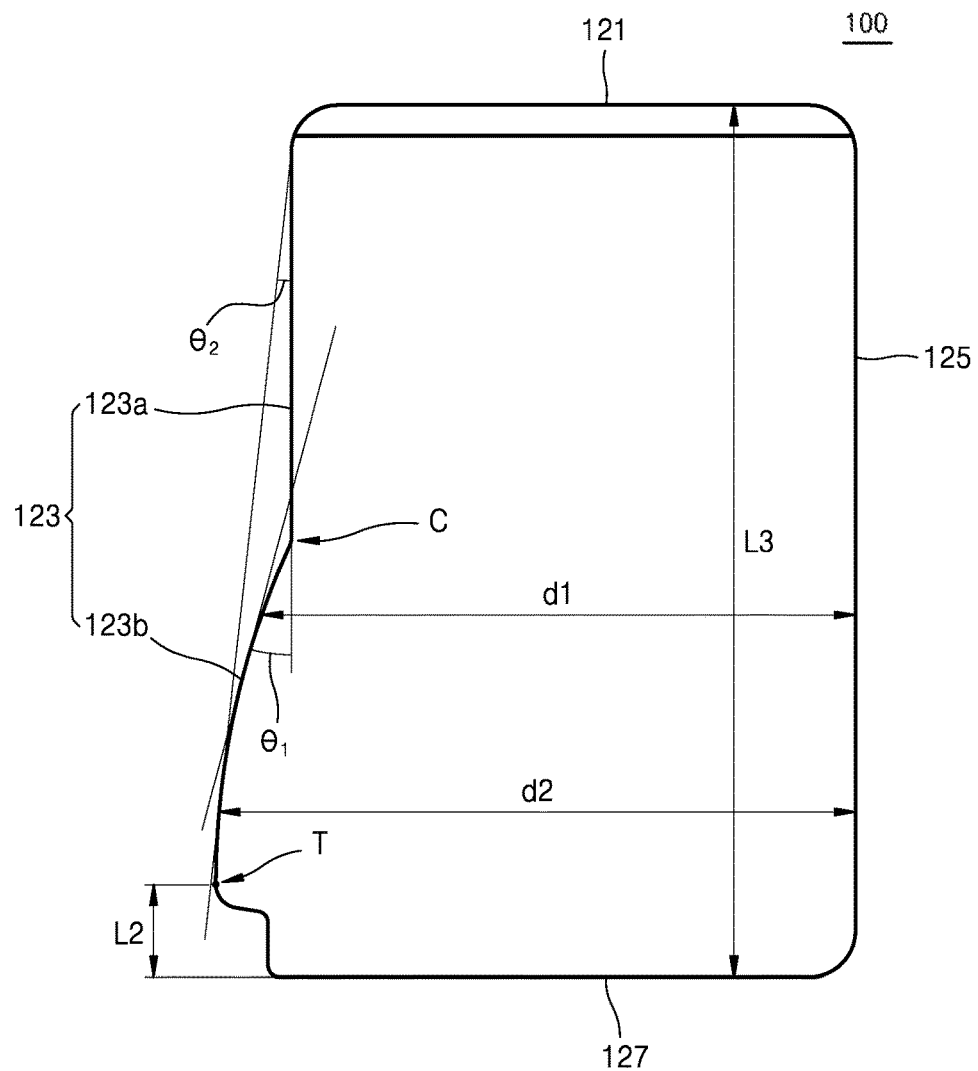
[Fig. 5A]
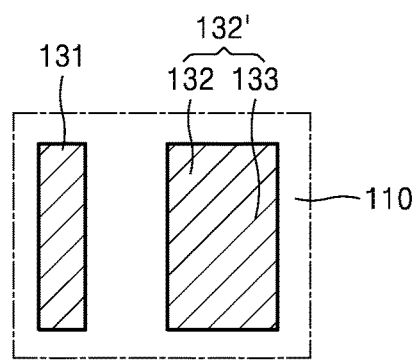

[Fig. 5B]
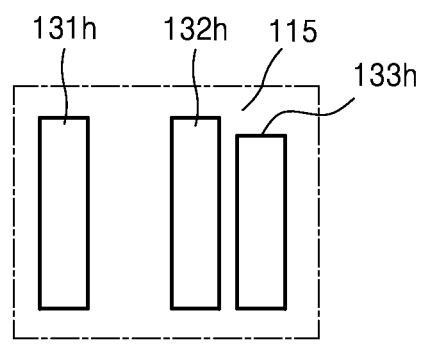
[Fig. 5C]
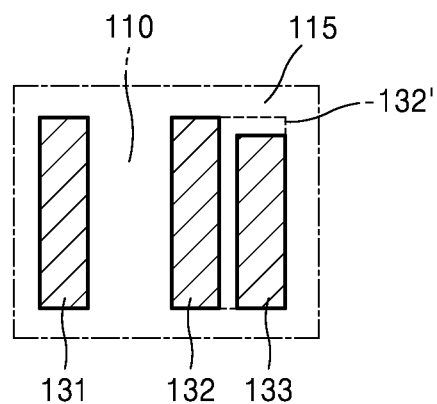

[Fig. 6]
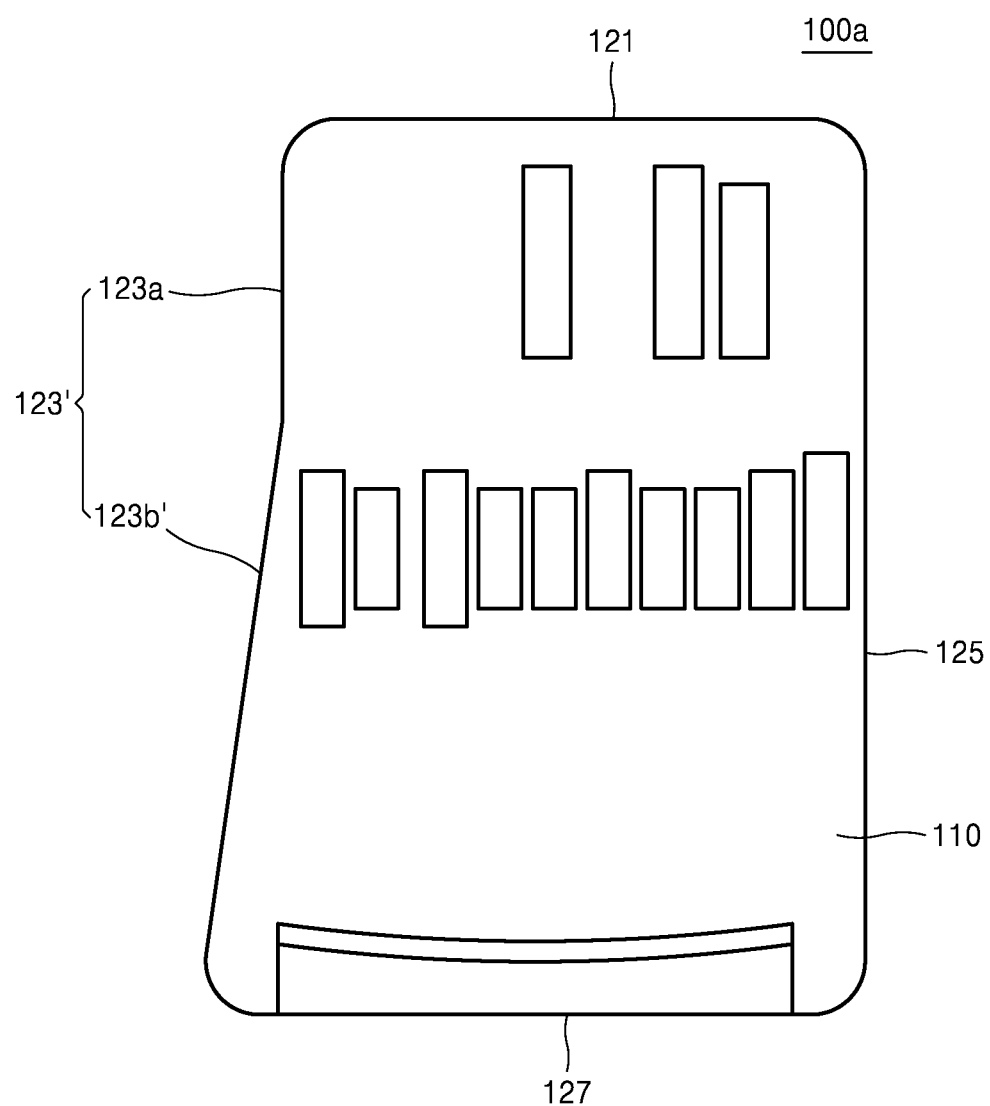

[Fig. 7]
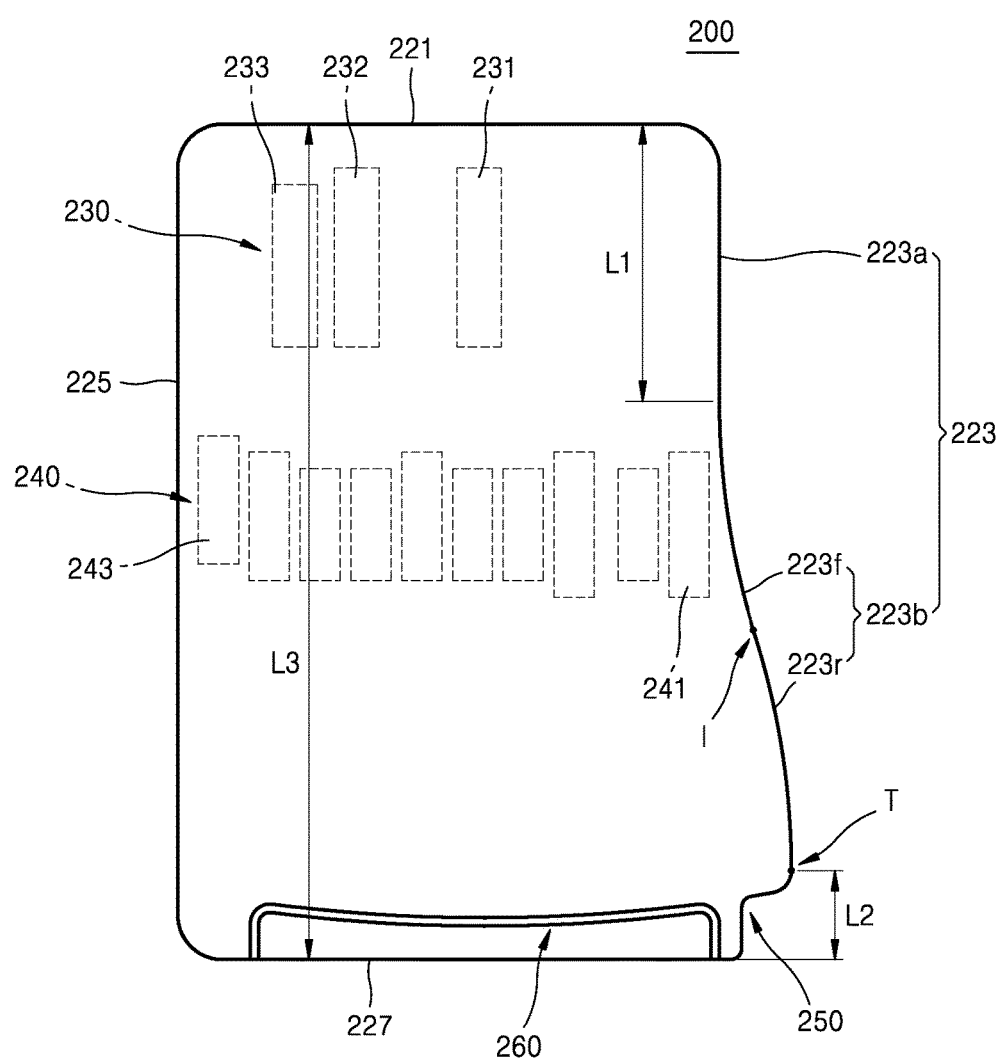

[Fig. 8]
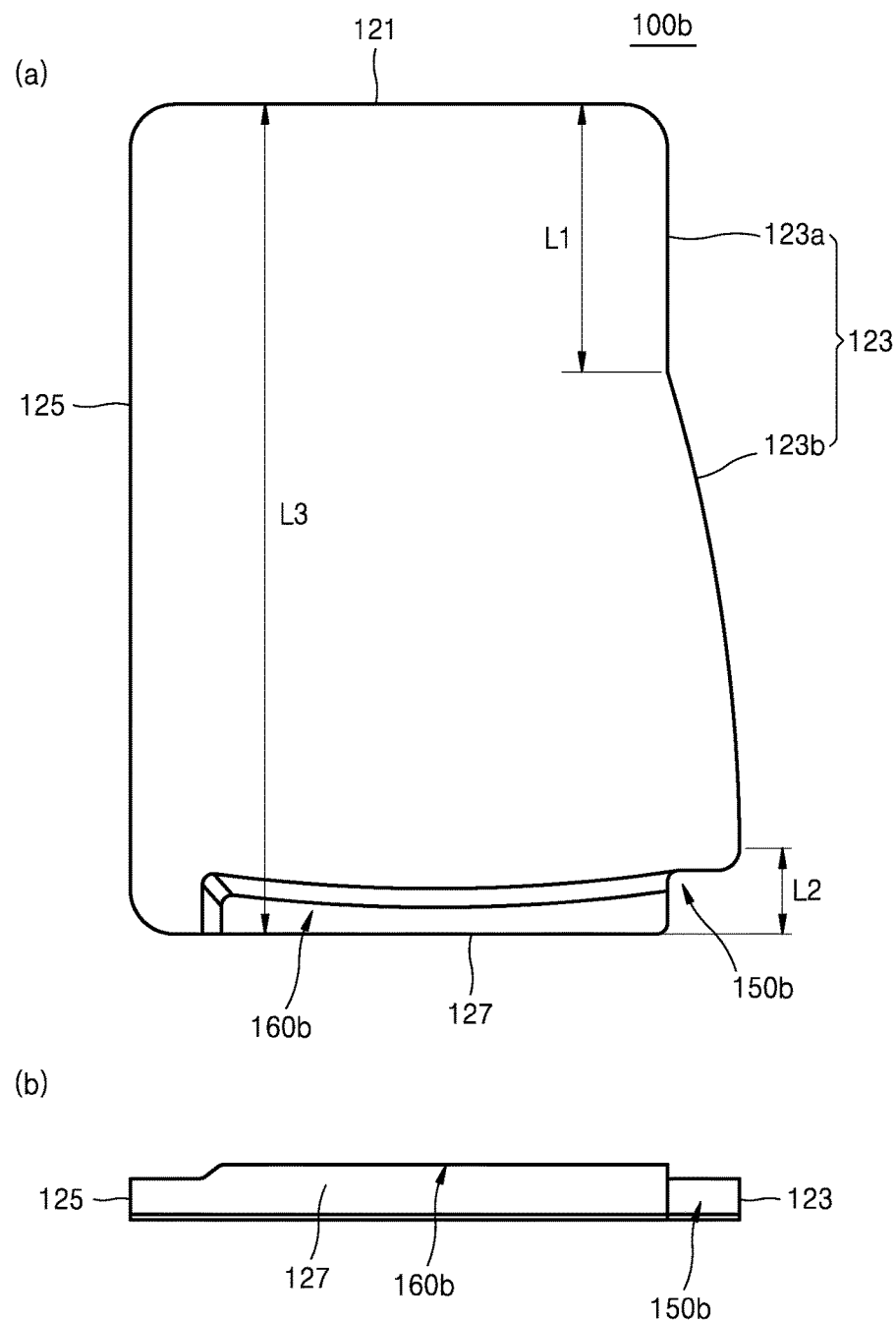

[Fig. 9]
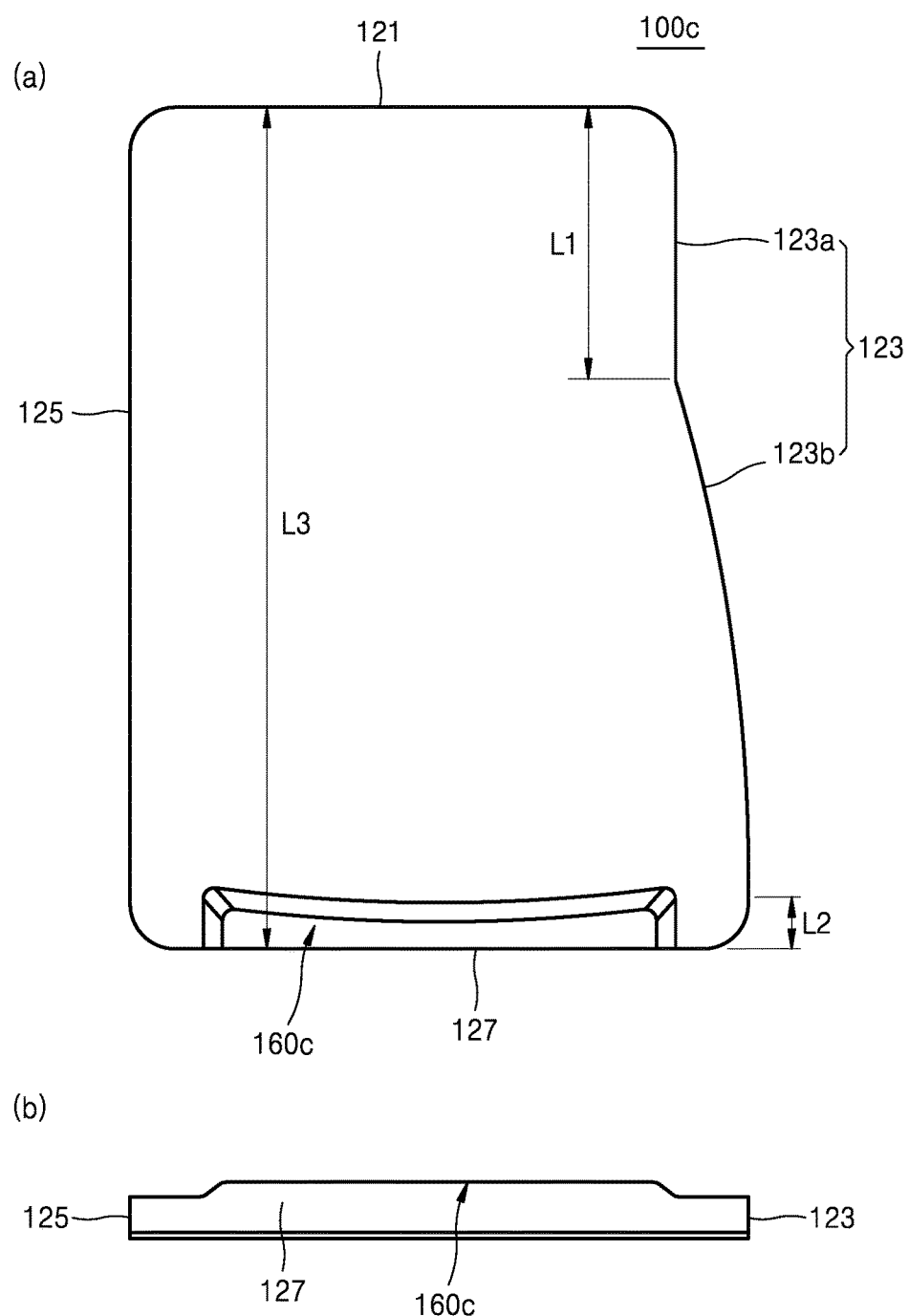

[Fig. 10]
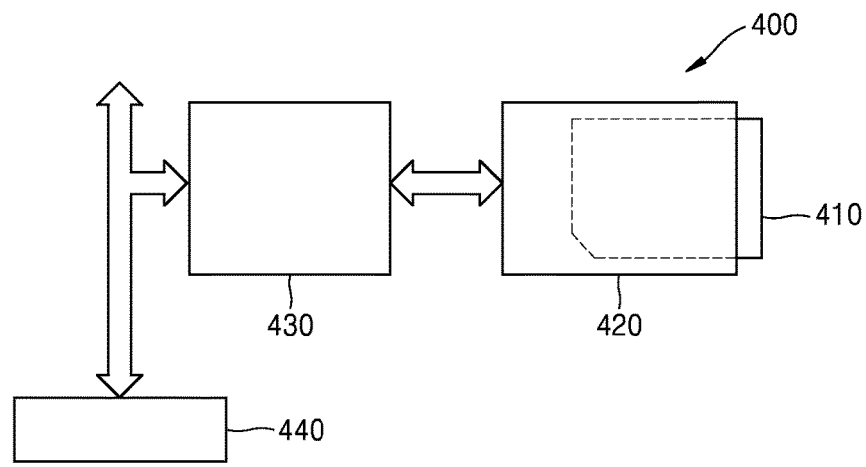
[Fig. 11]
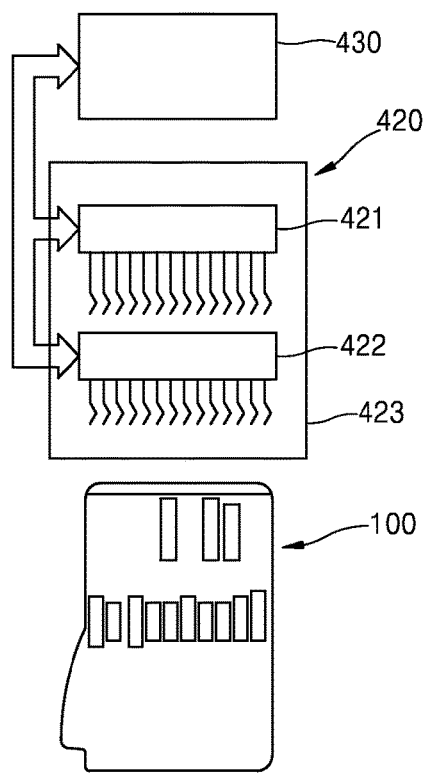

[Fig. 12]
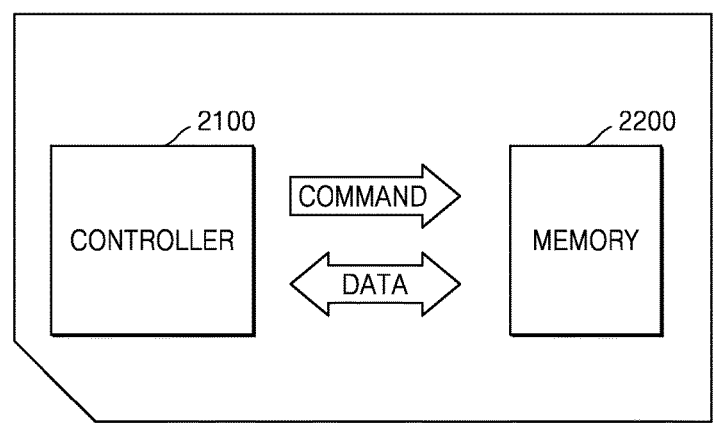
[Fig. 13]
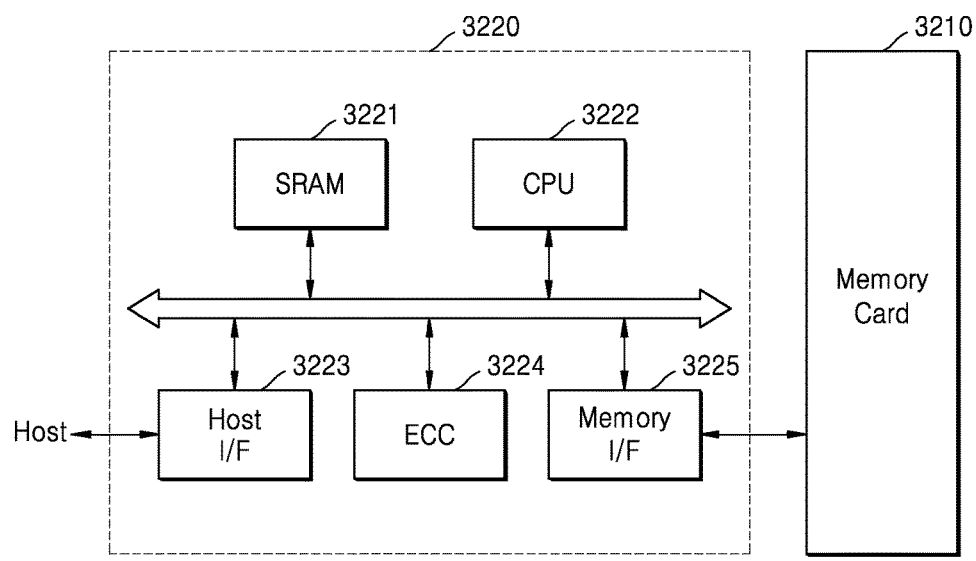

[Fig. 14]
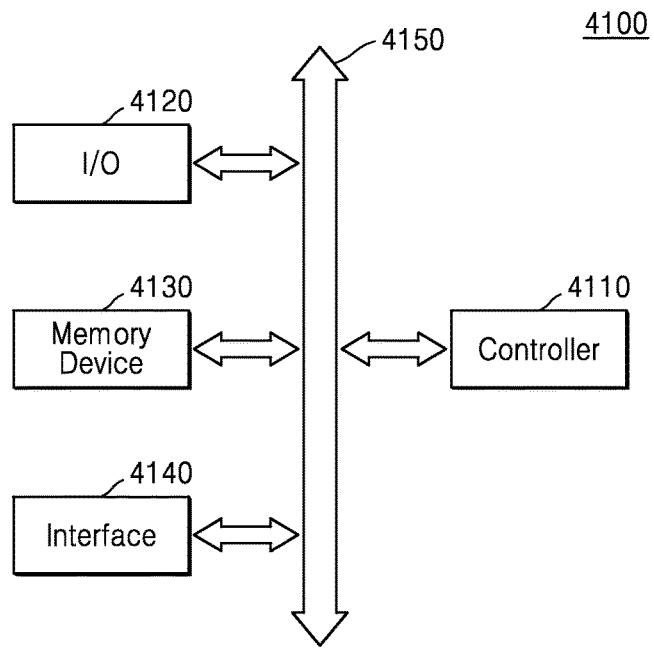
[Fig. 15]
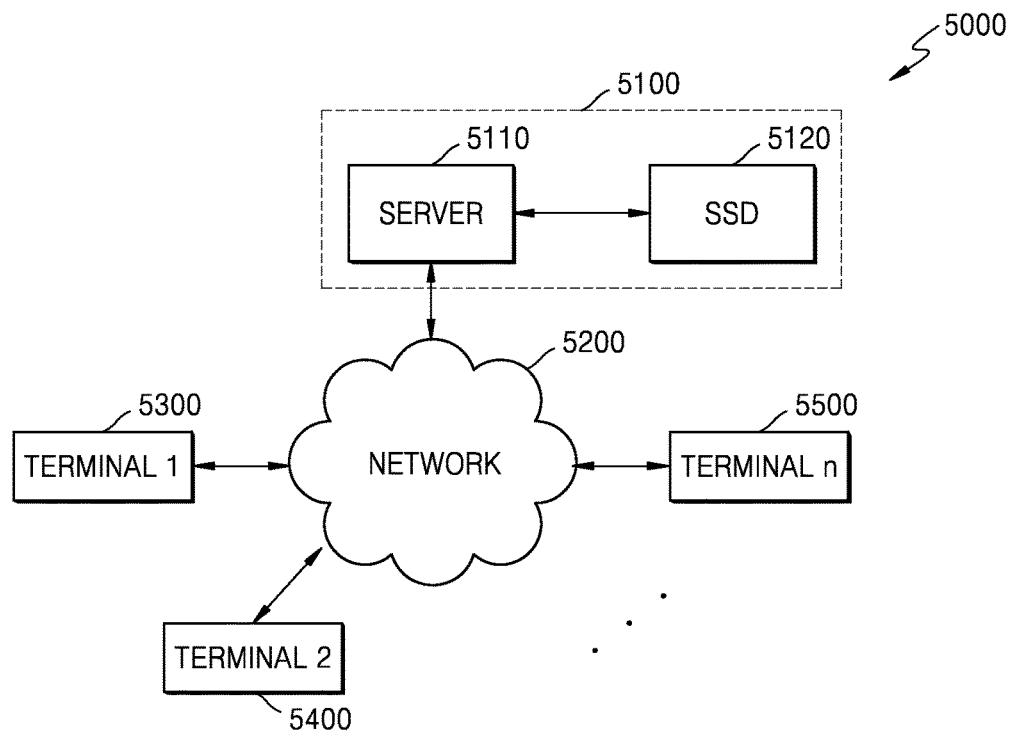

MEMORY CARD HAVING MULTI-ROW TERMINALS

CLAIM OF PRIORITY

This application is a 35 U.S.C. § 371 national stage application of PCT Application No. PCT/KR2015/006695, filed on Jun. 30, 2015, which claims the benefit of Korean Patent Application No. 10-2014-0081215, filed on Jun. 30, 2014, in the Korean Intellectual Property Office, the disclosures of which are incorporated herein by reference in their entireties. The above-referenced PCT International Application was published as International Publication No. WO 2016/003155 A1 on Jan. 7, 2016.

TECHNICAL FIELD

The inventive concept relates to a memory card, and more particularly, to a memory card, which may be easily reset in terms of software and smoothly attached or detached during insertion of the memory card into a socket to reduce damage to a device.

BACKGROUND ART

Since a memory card may easily store and carry a large capacity of information, the memory card may be widely used for portable phones and laptop computers. The memory card may have various sizes as needed. Due to the increased demand for high-speed, high-capacity, and small-sized memory cards, downscaled memory cards having high storage speeds and high capacities have been developed and put on the market.

Meanwhile, as memory specifications having a higher storage speed are adopted, instability of a memory card with the memory specifications may become more problematic. Thus, it is necessary to consider methods for solving the instability from different angles.

DISCLOSURE OF INVENTION

Technical Problem

The inventive concept provides a memory card that may be easily reset in terms of software and smoothly attached and detached during insertion of the memory card into a socket to reduce damage to a device.

The inventive concept also provides a socket in which the memory card may be contained.

Furthermore, the inventive concept provides an electronic system including the memory card.

Solution to Problem

According to an aspect of the inventive concept, there is provided a memory card having two pairs of opposite edges, the memory card including: a substrate, a plurality of first row terminals arranged adjacent to an insertion-side edge of the memory card and including a first-voltage power supply terminal, and a plurality of second row terminals arranged more apart from the insertion-side edge than the first row terminals and including a second-voltage power supply terminal. From among both edges of the memory card adjacent to the insertion-side edge, a first edge includes a first portion substantially parallel to a second edge disposed opposite to the first edge and a second portion disposed at an angle to the second edge. The second portion extends from an end point of the first portion of the first edge toward a third edge disposed opposite the insertion-side edge and becomes monotonously far from the second edge, and a position in which a distance between the first edge and the second edge is longest is present only in the second portion.

A middle point of an arbitrary segment of the second portion may be located outward from a straight line connecting both ends of the segment or located on the straight line. A length of the first portion may range from about 30% to about 70% of a distance between the insertion-side edge and the third edge. An angle formed by an arbitrary tangent line of the second portion with the first portion may range from about 0° to about 40°. Optionally, the second portion may end at a point where the angle that has been gradually reduced reaches 0°.

As a contact point of the tangent line of the second portion becomes far away from the first portion, the angle formed by the tangent line of the second portion with the first portion may be reduced. Also, a shortest distance between the point where the second portion ends and an extension line of the third edge may range from about 1% to about 15% of the distance between the insertion-side edge and the third edge.

The memory card may include a notch portion provided adjacent to the third edge. In particular, the notch portion may be disposed between the second portion and the third edge.

A withdrawal assisting portion may be disposed adjacent to the third edge on a reverse surface of a surface on which the second row terminals are formed. A passive device may be disposed on the substrate under the withdrawal assisting portion. Optionally, a passive device is disposed on the substrate between an extension line of the first portion of the first edge and the second portion.

In the memory card, the second row terminals may include a reset terminal. The reset terminal may be configured to reset the memory card in response to a reset signal received from a host. The reset terminal may be configured to interrupt and restart application of the second voltage in response to the reset signal.

The first row terminals of the memory card may include a first ground terminal and a second ground terminal. The second ground terminal may be exposed adjacent to the first ground terminal. For example, the first ground terminal may be provided in a position corresponding to a ground terminal of an ultra-high speed 1 (UHS-1) card. Also, the second ground terminal may be provided in a position corresponding to a data terminal of the UHS-1 card. The first ground terminal and the second ground terminal may be electrically and directly connected to each other. Optionally, the first ground terminal and the second ground terminal may be integrated. A space between a portion exposed as the first ground terminal and a portion exposed as the second ground terminal may be coated with an insulating material. A distance between the first ground terminal and the insertion-side edge may be smaller than a distance between the second ground terminal and the insertion-side edge.

In the memory card, an interface between the first portion and the second portion may be disposed farther from the insertion-side edge than the centers of the second row terminals.

Optionally, as the second portion becomes far away from the first portion, the second portion may sequentially have a front portion having a concave shape and a rear portion having a convex shape. An angle formed by an arbitrary tangent line of the front portion of the second portion with the first portion or an extension line of the first portion may gradually increase as a contact point of the arbitrary tangent line of the front portion of the second portion becomes far away from the first portion. Also, an angle formed by an arbitrary tangent line of the rear portion of the second portion with the first portion or an extension line of the first portion may gradually decrease as a contact point of the arbitrary tangent line of the rear portion of the second portion becomes far away from the first portion. An angle formed by an arbitrary tangent line of the second portion with the first portion or an extension line of the first portion may range from about 0° to about 25°.

According to another aspect of the inventive concept, there is provided a memory card having two pairs of opposite edges, the memory card including: a substrate, a plurality of first row terminals arranged adjacent to an insertion-side edge of the memory card and including a power supply terminal having a first voltage, and a plurality of second row terminals arranged more apart from the insertion-side edge than the first row terminals and including a power supply terminal having a second voltage. The first row terminals include a first ground terminal and a second ground terminal exposed adjacent to the first ground terminal.

According to another aspect of the inventive concept, there is provided a socket into which a memory card including a plurality of first row terminals arranged adjacent to an insertion-side edge and a plurality of second row terminals arranged more apart from the insertion-side edge than the first row terminals is inserted. The socket includes first row-correspondence socket terminals corresponding to the first row terminals, second row-correspondence socket terminals corresponding to the second row terminals, and a housing configured to contain the first row-correspondence socket terminals and the second row-correspondence socket terminals. The socket is electrically connected to a card interface controller configured to transmit and receive signals and/or data to and from the first row-correspondence socket terminals and the second row-correspondence socket terminals. The first row-correspondence socket terminals include a socket terminal configured to recognize the inserted memory card as a first-type card when a terminal corresponding to the inserted memory card is a ground terminal, and recognize the inserted memory card as a second-type card when the terminal corresponding to the inserted memory card is a data terminal.

According to another aspect of the inventive concept, there is provided an electronic system including: a controller, an input/output (I/O) unit configured to input or output data, a memory unit configured to store data, an interface unit configured to transmit and receive data to and from an external device, and a bus configured to connect the controller, the I/O unit, the memory unit, and the interface unit such that the controller, the I/O unit, the memory unit, and the interface unit communicate with one another. The memory unit comprises the above-described memory card.

Advantageous Effects of Invention

A memory card according to an embodiment of the inventive concept can be easily reset in terms of software without controlling power supply in terms of hardware. Also, the memory card can be smoothly attached and detached during insertion of the memory card into a socket and reduce damage to a device.

BRIEF DESCRIPTION OF DRAWINGS

Exemplary embodiments of the inventive concept will be more clearly understood from the following detailed description taken in conjunction with the accompanying drawings in which:

FIG. 1 is a plan view of a memory card according to an embodiment of the inventive concept;

FIG. 2 is a partial enlarged view of portion A of the memory card of FIG. 1;

FIG. 3 is a rear view showing a reverse surface of the memory card of FIG. 1;

FIG. 4 is a detailed plan view of a shape of a second portion of FIG. 1;

FIGS. 5A through 5C are schematic diagrams of terminals according to an embodiment of the inventive concept;

FIGS. 6 and 7 are plan views of memory cards according to other embodiments of the inventive concept;

FIGS. 8 and 9 are plan views and side views of memory cards according to other embodiments of the inventive concept;

FIG. 10 is a schematic diagram of a system using a memory card according to embodiments of the inventive concept;

FIG. 11 is a detailed schematic diagram of a socket of FIG. 10;

FIG. 12 is a schematic construction diagram of a memory card according to an embodiment of the inventive concept;

FIG. 13 is a block diagram of a memory device including a memory card according to an embodiment of the inventive concept;

FIG. 14 is a block diagram of an electronic system including a memory card according to an embodiment of the inventive concept; and FIG. 15 is a block diagram of a network for a server system including an electronic device according to an embodiment of the inventive concept.

BEST MODE FOR CARRYING OUT THE INVENTION

As used herein, the term "and/or" includes any and all combinations of one or more of the associated listed items. Expressions such as "at least one of," when preceding a list of elements, modify the entire list of elements and do not modify the individual elements of the list.

The inventive concept will now be described more fully hereinafter with reference to the accompanying drawings, in which exemplary embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. Like numbers refer to like elements throughout. In the drawings, the thicknesses of layers and regions are exaggerated for clarity. The inventive concept should not be limited by relative sizes or intervals shown in the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless explicitly so defined herein.

FIG. 1 is a plan view of a memory card 100 according to an embodiment of the inventive concept. FIG. 2 is a partial enlarged view of portion A of the memory card of FIG. 1. FIG. 3 is a rear view showing a reverse surface of the memory card of FIG. 1.

Referring to FIGS. 1 through 3, the memory card 100 may have two pairs of opposite edges. The two pairs of edges may have an insertion-side edge 121 disposed in a direction in which the memory card 100 is inserted into a socket, and a first edge 123 and a second edge 125 disposed adjacent to the insertion-side edge 121. Also, the memory card 100 may have a third edge 127 disposed opposite the insertion-side edge 121. The insertion-side edge 121 and the third edge 127 may be parallel to each other.

The second edge 125 may extend in a direction vertical to the direction in which the insertion-side edge 121 extends. Also, the second edge 125 may extend only in a single direction. Furthermore, the first edge 123 may include both a portion parallel to the second edge 125 and a portion non-parallel to the second edge 125.

Corners having a predetermined radius of curvature may be disposed between the respective edges 121, 123, 125, and 127. The corners may have the same radius of curvature or different radii of curvature.

The insertion-side edge 121 may be an edge toward which the memory card 100 is inserted. The insertion-side edge 121 may be the first one of the edges 121, 123, and 125, and 127 to enter the socket during insertion of the memory card 100 into the socket, and be the last one of the edges 121, 123, 125, and 127 to escape from the socket during the withdrawal of the memory card 100 from the socket. A width of the insertion-side edge 121 may be determined in consideration of a predetermined margin for a difference between the width of the insertion-side edge 121 and a width of the socket so that the memory card 100 can smoothly enter the socket.

Terminals may be arranged adjacent to the insertion-side edge 121 to electrically connect semiconductor devices of the memory card 100 with a host. The host may be, for example, a portable phone, a desk-top computer, a laptop computer, a tablet personal computer (PC), a game console, a navigation device, or a digital camera, but the inventive concept is not limited thereto. Also, an adaptor for interfacing the memory card 100 with the host may be interposed between the memory card 100 and the host.

The terminals may be arranged in two rows as shown in FIG. 1. That is, a plurality of first row terminals 130 and a plurality of second row terminals 140 may be arranged adjacent to the insertion-side edge 121 of the memory card 100.

The first row terminals 130 may include a power supply terminal 131 having a first voltage, and the first voltage may be, for example, between about 3.0 V to about 3.5 V. The first voltage may be applied to semiconductor devices that perform a low-speed operation from among semiconductor devices of the memory card 100.

The second row terminals 140 may include a power supply terminal 141 having a second voltage, and the second voltage may be, for example, about 1.5 V to about 2.2 V. The second voltage may be applied to semiconductor devices that perform a high-speed operation from among the semiconductor devices of the memory card 100.

As shown in FIG. 1, the first row terminals 130 may be arranged closer to the insertion-side edge 121 than the second row terminals 140. That is, the second row terminals 140 may be arranged more apart from the insertion-side edge 121 than the first row terminals 130.

Although FIG. 1 illustrates three (3) first row terminals 130 and ten (10) second row terminals, the numbers, positions, shapes, and sizes of terminals are not limited thereto and may be changed as needed. Also, some of the terminals 130 and 140 may be coated with a solder resist (SR) layer but not exposed. The unexposed some terminals may be, for example, test terminals.

Each of the first row terminals 130 and the second row terminals 140 may have at least one ground terminal. Also, the first row terminals 130 and/or the second row terminals 140 may include at least one data terminal. Furthermore, the second row terminals 140 may include a reset terminal 143. The reset terminal 143 will be described below in further detail.

The first edge 123 may include a first portion 123a substantially parallel to the second edge 125 and a second portion 123b non-parallel to the second edge 125. Here, it will be understood that when an element is referred to as being "substantially parallel to" another element, the two elements can be parallel to each other within a range of manufacturing tolerances.

The first portion 123a may start from a portion adjacent to the insertion-side edge 121 and end at a portion adjacent to the second portion 123b. As described above, the first portion 123a may be connected to the insertion-side edge 121 by a corner having a predetermined radius of curvature.

The second portion 123b may start from a point where the first portion 123 ends, and extend toward the third edge 127. In this case, while extending toward the third edge 127, the second portion 123b may become monotonously far away from the second edge 125.

FIG. 4 is a detailed plan view of a shape of the second portion 123b. Referring to FIG. 4, as the second portion 123b extends from a point C where the first portion 123a ends, toward the third edge 127, a distance between the second portion 123b and the third edge 127 may monotonously increase. That is, a distance d2 between the second portion 123b and the second edge 125 obtained when the second portion 123b is far from the end point C of the first portion 123a may be consistently greater than a distance d1 between the second portion 123b and the second edge 125 obtained when the second portion 123b is close to the end point C of the first portion 123a.

Also, as the second portion 123b extends toward the third edge 127, a distance between the second portion 123b and the second edge 125 may consistently increase. Thus, a distance between the first edge 123 and the second edge 125 may be maximized at a point that exists within the second portion 123b. Furthermore, the point where the distance between the first edge 123 and the second edge 125 is maximized may exist only in the second portion 123b. For example, the point where the distance between the first edge 123 and the second edge 125 is maximized may be a connection point between the second portion 123b and the third edge 127.

As shown in FIG. 4, the second portion 123b and the third edge 127 may be connected by a corner having a predetermined radius of curvature as described above. In this case, a distance between the first edge 123 and the second edge 125 may be maximized at a portion of the second portion 123b, which is connected to the corner having the radius of curvature.

Referring to FIG. 2, a middle point of an arbitrary segment of the second portion 123b may be located on a straight line connecting both ends of the segment or located more outward from the memory card (refer to 100 in FIG. 1) than the straight line. That is, a middle point M of a segment PQ of the second portion 123b may be located more outward from the memory card 100 than the straight line connecting the both ends of the segment PQ. Alternatively, as described below, the second portion 123b may have a straight portion. In this case, the middle point M of the segment PQ of the second portion 123b may be located on the straight line connecting the both ends of the segment PQ.

Referring to FIG. 3, a length L1 of the first portion 123a may be about 30% to about 70% of a distance L3 between the insertion-side edge 121 and the third edge 127. That is, the first portion 123a may extend by a length ranging from about 30% to about 70% of the distance L3, and then connect with the second portion 123b.

In this case, a tangent line at an arbitrary point on the second portion 123b may form an angle of about 0° to about 40° with the first portion 123a or an extension line of the first portion 123a. Since the second portion 123b forms a relatively gentle angle with the first portion 123a, friction or impact caused by a contact or collision of the memory card 100 with both sidewalls of the socket may be markedly reduced during the insertion of the memory card 100 into the socket. Therefore, semiconductor devices mounted in the memory card 100 may be protected effectively, and the memory card 100 may be smoothly inserted into the socket.

Meanwhile, the angle formed by the tangent line with the first portion 123a or the extension line thereof may be reduced as a contact point of the tangent line becomes far away from the first portion 123a. Referring back to FIG. 4, an angle θ1 formed by a tangent line at a point of the second portion 123b that is relatively close to the first portion 123a, with the first portion 123a, may be greater than an angle θ2 formed by a tangent line at a point on the second portion 123b that is relatively far from the first portion 123a, with the first portion 123a.

As the arbitrary point on the second portion 123b becomes far from the first portion 123a, the angle formed by the tangent line at the arbitrary point on the second portion 123b with the first portion 123a or the extension line of the first portion 123a may be gradually reduced and finally reach 0°. A point where the angle formed by the tangent line with the first portion 123a or the extension line of the first portion 123a becomes 0° may be defined as an end point T of the second portion 123b.

Referring to FIG. 4, a corner having a radius of curvature may be formed between the second portion 123b and the third edge 127. A point of the second portion 123b connected to the corner may be the end point T of the second portion 123b. In this case, a shortest distance L2 between the end point T of the second portion 123b and an extension line of the third edge 127 may range from about 1% to about 15% of a distance L3 between the insertion-side edge 121 and the third edge 127.

As shown in FIG. 4, while a width of the second portion 123b is increasing over almost half of a length of the memory card 100 in an inserted direction, the second portion 123b may form a very gentle angle with the first portion 123a.

Referring to FIGS. 1 and 3, an interface C (refer to FIG. 4) between the first portion 123a and the second portion 123b may be disposed farther from the insertion-side edge 121 than the centers of the second row terminals 140. The socket configured to accommodate the memory card 100 may receive the entire memory card 100 or receive only a portion of the memory card 100 to achieve a compact configuration. However, at least the second row terminals 140 may enter the socket so that the second row terminals 140 can be connected to socket terminals of the socket. If the second portion 123b is disposed closer to the insertion-side edge 121 than the centers of the second row terminals 140, a horizontal space corresponding to a width between the extension line of the first portion 123a and the second portion 123b may be further needed for the socket that receives the memory card 100. Accordingly, in order to achieve a more compact socket, a start point of the second portion 123b (i.e., an end point C of the first portion 123a) may be disposed farther from the insertion-side edge 121 than the centers of the second row terminals 140.

Referring to FIGS. 1 and 3, the memory card 100 may have a notch portion 150 disposed adjacent to the third edge 127. The notch portion 150 may be provided between the first edge 123 and the third edge 127 or provided between the second edge 125 and the third edge 127. In particular, the notch portion 150 may be provided between the second portion 123b of the first edge 123 and the third edge 127. As shown in FIG. 1, the notch portion 150 may be recessed in an L shape.

Referring to FIG. 3, a withdrawal assisting portion 160 may be formed on one surface of the memory card 100. The withdrawal assisting portion 160 may enable the memory card 100 to be easily withdrawn from the socket after the memory card 100 is inserted into the socket. The withdrawal assisting portion 160 may protrude from the surface of the memory card 100. Also, the withdrawal assisting portion 160 may be formed adjacent to the third edge 127.

In this case, among side surfaces of the withdrawal assisting portion 160 that protrude from the surface of the memory card 100, a central portion of a side surface of the withdrawal assisting portion 160, which is opposite to the third edge 127, may be concave toward the third edge 127. Due to this configuration, when the memory card 100 is withdrawn from the socket, contact conformity of the memory card 100 with fingers may be increased so that the memory card 100 can be withdrawn conveniently.

As shown in FIG. 3, the withdrawal assisting portion 160 may be formed on a reverse surface of a surface on which the second row terminals 140 are formed. Furthermore, a passive device 170 may be provided in the withdrawal assisting portion 160. That is, the passive device 170 may be disposed on the substrate 110 disposed under the withdrawal assisting portion 160.

As shown in FIG. 1, the passive device 170 may be disposed on the substrate 110 between the extension line of the first portion 123a of the first edge 123 and the second portion 123b.

The passive device 170 may include, for example, at least one selected from a resist, a capacitor, an inductor, a thermistor, an oscillator, a ferrite bead, an antenna, a varistor, and a crystal. However, the passive device 170 is not limited thereto and may be another arbitrary passive device.

The plurality of second row terminals 140 may include a reset terminal 143. The reset terminal 143 may be configured to reset the memory card 100 in response to a reset signal received from the host. In other words, the reset terminal 143 may be configured to re-start an operation of the memory card 1 when the reset terminal 143 receives the reset signal from the host.

For example, the memory card 100 may be firmware-programmed to perform a reset operation when the reset terminal 143 receives the reset signal from the host. For example, firmware may be configured such that when the reset terminal 143 receives the reset signal from the host, power supplied to the memory card 100 is interrupted for a predetermined time and then applied again. In this case, the interrupted power may be a power of the second voltage.

FIGS. 5A through 5C are schematic construction diagrams of terminals according to an embodiment of the inventive concept, which illustrates a method of forming the first row terminals 130 of FIG. 1, according to an embodiment of the inventive concept.

Referring to FIG. 5A, terminals 131 and 132' may be formed on a surface of the substrate 110. The terminals 131 and 132' may include a power supply terminal 131 having a first voltage and a ground terminal 132'. The ground terminal 132' may be a terminal in which a first ground terminal 132 and a second ground terminal 133 to be described below are integrated.

Referring to FIG. 5B, an insulating layer 115 may be provided to coat the substrate 110 and expose the terminals 131 and 132'. The insulating layer 115 may have openings 131h, 132h, and 133h to expose the terminals 131 and 132'.

Referring to FIG. 5C, the substrate 110 of FIG. 5A may be covered and coated with the insulating layer 115 of FIG. 5B. The electrodes 131, 132, and 133 may be exposed respectively in correspondent to the openings 131h, 132h, and 133h shown in FIG. 5B. As can be seen from FIG. 5A, the first ground terminal 132 and the second ground terminal 133 may be integrated under the insulating layer 115. However, a space between a portion exposed as the first ground terminal 132 and a portion exposed as the second ground terminal 133 may be covered with the insulating layer 115.

Referring to FIGS. 1, 5A, 5B, and 5C, the plurality of first row terminals may include a power supply terminal 131 having a first voltage, a first ground terminal 132, and a second ground terminal 133 exposed adjacent to the first ground terminal 132. As mentioned above, although FIG. 1 illustrates a case in which three first row terminals are exposed, four or more terminals may be formed and/or exposed.

In particular, a distance between the first ground terminal 132 and the insertion-side edge 121 of the memory card 100 may be different from a distance between the second ground terminal 133 and the insertion-side edge 121 of the memory card 100. For example, the distance between the second ground terminal 133 and the insertion-side edge 121 may be greater than the distance between the first ground terminal 132 and the insertion-side edge 121.

For example, the first ground terminal 132 may be provided in the same position as a ground terminal of a mini secure-digital (SD) card. In particular, the first ground terminal 132 may be provided in the same position as a ground terminal of an ultra-high speed 1 (UHS-1) card.

For example, the second ground terminal 133 may be provided in a position corresponding to a data terminal of a mini-SD card. In particular, the second ground terminal 133 may be provided in a position corresponding to a data terminal of a UHS-1 card.

When the memory card 100 is inserted into a socket of a conventional UHS-1 card, since the second ground terminal 133 is located in a position corresponding to a data terminal of the UHS-1 card, a host may recognize the inserted memory card 100 as a different kind of card that does not meet standards for UHS-1 cards, and stop inputting and outputting data to and from the inserted memory card 100.

FIGS. 5A through 5C illustrate an example in which the first ground terminal 132 and the second ground terminal 133 are integrated, but the inventive concept is not limited thereto. For example, a first ground terminal and a second ground terminal may be separately formed and electrically connected to attain the same object.

FIG. 6 is a plan view of a memory card 100a according to another exemplary embodiment.

Referring to FIG. 6, the memory card 100a differs from the memory card 100 shown in FIGS. 1 through 3 in that a second portion 123b' of a first edge 123' includes a straight shape.

Since the second portion 123b' includes the straight shape, a middle point of an arbitrary segment of the second portion 123b' may be located on a straight line connecting both ends of the segment. Also, a tangent line of an arbitrary point on the second portion 123b' may form a constant angle with a first portion 123a.

Although FIG. 6 illustrates an example in which the second portion 123b' is consistently located on the same straight line, the inventive concept is not limited thereto. For example, the second portion 123b' may be divided into several sections, and a tangent line of an arbitrary point on the second portion 123b' with the first portion 123a or an extension line of the first portion 123a may be discontinuously reduced.

FIG. 7 is a plan view of a memory card 200 according to another exemplary embodiment of the inventive concept.

Referring to FIG. 7, the memory card 200 may have two pairs of opposite edges. The two pairs of edges may have an insertion-side edge 221 disposed in a direction in which the memory card 200 is inserted into a socket, and a first edge 223 and a second edge 225 disposed adjacent to the insertion-side edge 221. Also, the memory card 200 may have a third edge 227 disposed opposite the insertion-side edge 221. The insertion-side edge 221 and the third edge 227 may be parallel to each other.

The second edge 225 may extend in a direction vertical to the direction in which the insertion-side edge 221 extends. Also, the second edge 225 may extend only in a single direction. Furthermore, the first edge 223 may include both a portion parallel to the second edge 225 and a portion non-parallel to the second edge 225.

Terminals may be arranged adjacent to the insertion-side edge 221 to electrically connect semiconductor devices of the memory card 200 with a host. The terminals may be arranged in two rows as shown in FIG. 7. That is, a plurality of first row terminals 230 and a plurality of second row terminals 240 may be arranged adjacent to the insertion-side edge 221. The first row terminals 230 may be arranged closer to the insertion-side edge 221 than the second row terminals 240.

The first row terminals 230 may include a power supply terminal 231 having a first voltage, and the second row terminals 240 may include a power supply terminal 241 having a second voltage. Also, the first row terminals 230 may include a first ground terminal 232 and a second ground terminal 233.

Also, the memory card 200 may have a notch portion 250 and a withdrawal assisting portion 260. Since the notch portion 250 and the withdrawal assisting portion 260 have been described in detail with reference to FIGS. 1 and 3, additional descriptions thereof are omitted.

The memory card 200 shown in FIG. 7 differs from the memory card 100 shown in FIG. 1 and the memory card 100a shown in FIG. 6 in that as a second portion 223b becomes far away from a first portion 223a, a shape of the second portion 223b becomes concave and then convex toward the inside of the memory card 200.

More specifically, a length L1 of the first portion 223a may be about 30% to about 70% of a distance L3 between the insertion-side edge 221 and the third edge 227.

The second portion 223b may have a front portion 223f, which may have a concave shape toward the inside of the memory card 200, and a rear portion 223r, which may have a convex shape toward the inside of the memory card 200. As the front portion 223f becomes far away from the first portion 223a, an angle formed by an arbitrary tangent line with the first portion 223a or an extension line of the first portion 223a may increase. Also, as the rear portion 223r becomes far away from the first portion 223a, an angle formed by an arbitrary tangent line with the first portion 223a or the extension line of the first portion 223a may be reduced. An interfacial portion between the front portion 223f and the rear portion 223r may be an inflection point I of a curve of the second portion 223b.

A middle point of an arbitrary segment of the front portion 223f may be located more inward from the memory card 200 than a straight line connecting both ends of the segment. A middle point of an arbitrary segment of the rear portion 223r may be located more outward from the memory card 200 than the straight line connecting the both ends of the segment.

An angle formed by a tangent line of an arbitrary point on the second portion 223b with the first portion 223a or an extension line of the first portion 223a may be gradually reduced and finally reach 0° as the arbitrary point passes through the inflection point I and approaches the third edge 227. A point where an angle formed by the tangent line of the corresponding point on the second portion 223b with the first portion 223a or the extension line of the first portion 223a is 0° may be defined as an end point T of the second portion 223b.

A shortest distance L2 between the end point T of the second portion 223b and an extension line of the third edge 227 may range from about 1% to about 15% of the distance L3 between the insertion-side edge 221 and the third edge 227.

Furthermore, an angle formed by a tangent line of an arbitrary point on the second portion 223b with the first portion 223a or the extension line of the first portion 223a may range from about 0° to about 25°. Since the second portion 223b forms a very gentle angle with the first portion 223a, friction and impact caused by a contact or collision of the memory card 200 with both sidewalls of the socket may be markedly reduced during the insertion of the memory card 200 into the socket. Therefore, semiconductor devices mounted in the memory card 200 may be protected effectively, and the memory card 200 may be smoothly inserted into the socket.

FIGS. 8, and 9 are plan views and side views of memory cards 100b and 100c according to other embodiments of the inventive concept.

Referring to FIG. 8, the memory card 100b differs from the memory card 100 shown in FIG. 1 in that a withdrawal assisting portion 160b extends to a notch portion 150b. Also, the memory card 100b differs from the memory card 100 shown in FIG. 1 in that a first portion 123a has a relatively small length.

To begin with, a notch portion 150b may be provided adjacent to a third edge 127. As described above, the notch portion 150b may be recessed. Also, the withdrawal assisting portion 160b may extend to the notch portion 150b. That is, a level of the withdrawal assisting portion 160b may be elevated along the third edge 127, and the elevated level of the withdrawal assisting portion 160b may be maintained until the withdrawal assisting portion 160b reaches the notch portion 150b.

In particular, referring to FIG. 8, the withdrawal assisting portion 160b may have a relatively high level near the third edge 127. The withdrawal assisting portion 160b may maintain the relatively high level over at least a portion of the notch portion 150b.

Furthermore, the first portion 123a may have a length corresponding to about 30% of a distance L3 between the insertion-side edge 121 and the third edge 127.

As shown in FIGS. 1 and 4, when a point where a tangent line forms an angle of 0° with the first portion 123a or an extension line of the first portion 123a is defined as an end point T of the second portion 123b, a shortest distance L2 between the end point T of the second portion 123b and an extension line of the third edge 127 may be about 1% to about 15% of the distance L3 between the insertion-side edge 121 and the third edge 127.

Referring to FIG. 9, a notch portion may not be formed. In this case, a third edge 127 in which a withdrawal assisting portion 160c is formed may be connected to a second portion 123b of a first edge 123 via only a corner having a radius of curvature.

Terminals shown in FIG. 7 may be formed on a reverse surface of each of the memory cards 100b and 100c.

FIG. 10 is a schematic diagram of a system 400 using a memory card according to an embodiment of the inventive concept.

Referring to FIG. 10, the system 400 may include a socket 420, a memory card 410 that is as described in the previous embodiments, a card interface controller 430, and a host or an external device 440. The socket 420 may be provided to enable insertion of the memory card 410 and contact the memory card 410. The socket 420 may be electrically connected to first row terminals 130 and second row terminals 140 of the memory card 410 that is the same as shown in FIG. 1, FIG. 6 or FIG. 7. The card interface controller 430 may control exchange of data with the memory card 410 through the socket 420. Also, the card interface controller 430) may be used to store data in the memory card 410. The host 440 may control the card interface controller 430.

FIG. 11 is a detailed schematic diagram of the socket 420 of FIG. 10 in consideration of electrical connection of the socket 420 with the memory card 410.

Referring to FIG. 11, a socket 420 into which the above-described memory card 100, 100a, 100b, or 200 may be inserted may be provided.

The socket 420 may include first row-correspondence socket terminals 421 corresponding to the first row terminals 130 or 230 of the memory card 100, 100a, 100b, or 200, second row-correspondence socket terminals 422 corresponding to the second row terminals 140 or 240 of the memory card 100, 100*a*, 100*b*, or 200, and a housing 423 capable of containing the first row-correspondence socket terminals 421 and the second row-correspondence socket terminals 422.

The memory card 100, 100*a*, 100*b*, or 200 may be inserted into the housing 423 and operate when the memory card 100, 100*a*, 100*b*, or 200 contacts the first row-correspondence socket terminals 421 and the second row-correspondence socket terminals 422.

As described with reference to FIG. 10, the socket 420 may be electrically connected to the card interface controller 430 capable of receiving and outputting power, signals, and/or data from and to the first row-correspondence socket terminals 421 and the second row-correspondence socket terminals 422.

The first row-correspondence socket terminals 421 and the second row-correspondence socket terminals 422 may include a socket terminal configured to recognize the inserted memory card 100, 100*a*, 100*b*, or 200 as a first-type card when a specific terminal corresponding to the inserted memory card 100, 100*a*, 100*b*, or 200 is a ground terminal, and recognize the inserted memory card 100, 100*a*, 100*b*, or 200 as a second-type card when the specific terminal corresponding to the inserted memory card 100, 100*a*, 100*b*, or 200 is a data terminal. For example, the first-type card may be a universal flash storage (UFS) card, and the second-type card may be a micro-SD card. The micro-SD card may be a UHS-1 type or a UHS-2 type.

Although the previous embodiments describe an example in which three first row terminals are provided, four or more first row-correspondence socket terminals 421 may be provided to recognize even the second-type card. Similarly, second row-correspondence socket terminals 422 may be provided in a larger number than the number of second row terminals so as to recognize a different type of card. It will be understood to one of ordinary skill that a socket is not limited by the number of socket terminals shown in FIG. 11.

FIG. 12 is a schematic construction diagram of a memory card 2000 according to an embodiment of the inventive concept.

Specifically, the memory card 2000 may be disposed such that a controller 2100 and a memory 2200 exchange electric signals. For example, when the controller 2100 issues a command, the memory 2200 may transmit data.

The memory card 2000 may be one of various memory cards, for example, a memory stick card, a smart media (SM) card, a secure digital (SD) card, a mini-secure digital (mini-SD) card, a micro-secure digital (micro-SD) card, a multimedia card (MMC), and a UFS card.

FIG. 13 is a block diagram of a memory device 3200 including a memory card according to an embodiment of the inventive concept.

Referring to FIG. 13, the memory device 3200 according to the embodiment may include a memory card 3210. The memory card 3210 may include at least one of the memory cards according to the above-described embodiments. Also, the memory card 3210 may further include a different type of semiconductor memory device (e.g., a non-volatile memory device and/or a static RAM (SRAM) device). The memory device 3200 may include a memory controller 3220 configured to control exchange of data between a host Host and the memory card 3210.

The memory controller 3220 may include a processing unit 3222 configured to control a general operation of the memory device 3200. Also, the memory controller 3220 may include an SRAM 3221 used as an operation memory of the processing unit 3222. Furthermore, the memory controller 3220 may further include a host interface 3223 and a memory interface 3225. The host interface 3223 may include a data exchange protocol for exchanging data between the memory device 3200 and the host Host. The memory interface 3225 may connect the memory controller 3220 with the memory card 3210. Furthermore, the memory controller 3220 may further include an error correction block (ECC) 3224. The ECC 3224 may detect and correct errors in data read from the memory card 3210. Although not shown, the memory device 3200 may further include a read-only memory (ROM) device configured to store code data for interfacing the memory device 3200 with the host Host. The memory device 3200 may be embodied by an SSD that may replace a hard disk of a computer system.

FIG. 14 is a block diagram of an electronic system 4100 including a memory card according to an embodiment of the inventive concept.

Referring to FIG. 14, the electronic system 4100 according to an embodiment may include a controller 4110, an I/O device 4120, a memory device 4130, an interface 4140, and a bus 4150. The controller 4110, the I/O device 4120, the memory device 4130, and/or the interface 4140 may be combined with one another via the bus 4150. The bus 4150 may correspond to a path through which data is transmitted.

The controller 4110 may include at least one of a microprocessor, a digital signal processor, a microcontroller, and logic devices capable of similar functions thereto. The I/O device 4120 may include a keypad, a keyboard, and a display device. The memory device 4130 may store data and/or commands. The memory device 4130 may include at least one of the memory cards according to the above-described embodiments. Also, the memory device 4130 may further include a different type of semiconductor memory device (e.g., a non-volatile memory device and/or an SRAM device). The interface 4140 may function to transmit data to a communication network or receive data from the communication network. The interface 4140 may be a wired type or a wireless type. For example, the interface 4140 may include an antenna or a wired/wireless transceiver. Although not shown, the electronic system 4100 may further include a high-speed DRAM device and/or SRAM device, which serves as an operation memory device for improving an operation of the controller 4110.

The electronic system 4100 may be applied to a personal digital assistant (PDA), a portable computer, a web tablet, a wireless phone, a mobile phone, a digital music player, or all electronic products capable of transmitting and/or receiving information in wireless environments.

FIG. 15 is a block diagram of a network system 5000 for a server system 5100 including an electronic device 5120 according to an embodiment of the inventive concept.

Referring to FIG. 15, the network system 5000 according to an embodiment may include the server system 5100 and a plurality of terminals 5300, 5400, and 5500 connected via a network 5200. The server system 5100 according to an embodiment may include a server 5110 configured to process requests received from the plurality of terminals 5300, 5400, and 5500 connected to the network 5200, and the electronic device 5120 configured to store data corresponding to the requests received from the terminals 5300, 5400, and 5500. In this case, the electronic device 5120 may include, for example, at least one of memory cards shown in FIGS. 1 and 6 through 9, according to embodiments of the inventive concept. The electronic device 5120 may be, for example, a solid-state disk (SSD).

Meanwhile, the above-described electronic device according to embodiments may be mounted using various types of packages. For example, the electronic device according to an embodiment may be packaged using a Package on Package (PoP) technique, a ball grid array (BGA) technique, a chip-scale package (CSP) technique, a plastic-leaded chip carrier (PLCC) technique, a plastic dual in-line package (PDIP) technique, a die-in-waffle-pack technique, a die-in-wafer-form technique, a chip-on-board (COB) technique, a ceramic dual in-line package (CERDIP) technique, a plastic metric quad flat pack (MQFP) technique, a thin quad flatpack (TQFP) technique, a small outline (SOIC) technique, a shrink small outline package (SSOP) technique, a thin small outline (TSOP) technique, a thin quad flatpack (TQFP) technique, a system-in-package (SIP) technique, a multi-chip package (MCP) technique, a wafer-level fabricated package (WFP) technique, or a wafer-level processed stack package (WSP) technique.

A memory card according to an embodiment of the inventive concept can be easily reset in terms of software without controlling power supply in terms of hardware. Also, the memory card can be smoothly attached and detached during insertion of the memory card into a socket and reduce damage to a device.

While the inventive concept has been particularly shown and described with reference to exemplary embodiments thereof, it will be understood that various changes in form and details may be made therein without departing from the spirit and scope of the following claims.

The invention claimed is:

1. A memory card comprising:
a plurality of first row terminals arranged adjacent to an insertion side of the memory card and including a first-voltage power supply terminal; and
a plurality of second row terminals arranged farther apart from the insertion side than the plurality of first row terminals and including a second-voltage power supply terminal,
wherein both the plurality of first row terminals and the plurality of second row terminals are configured to be electrically connected to a socket for operation,
wherein the memory card comprises a first side and a second side adjacent to the insertion side and a third side opposite the insertion side, the first side is opposite the second side, and each of the first side and the second side is between the insertion side and the third side,
wherein the first side includes a first portion parallel to the second side and a second portion disposed at an angle to the second side, and the first portion of the first side is between the insertion side and the second portion of the first side,
wherein the second portion of the first side is curved and protrudes outwardly, and a position in which a distance between the first side and the second side is longest is in the second portion.

2. The memory card of claim 1, wherein a middle point of an arbitrary segment of the second portion that is curved and protrudes outwardly is located outward from a straight line connecting both ends of the arbitrary segment or is located on the straight line.

3. The memory card of claim 1, wherein a length of the first portion ranges from 30% to 70% of a distance between the insertion side and the third side.

4. The memory card of claim 3, wherein an angle formed by an arbitrary tangent line of the second portion with the first portion ranges from 0° to 40°.

5. The memory card of claim 4, wherein as a contact point of the arbitrary tangent line of the second portion becomes far away from the first portion, the angle formed by the arbitrary tangent line of the second portion with the first portion is reduced.

6. The memory card of claim 5, wherein the second portion ends at a point where the angle that has been gradually reduced reaches 0°.

7. The memory card of claim 6, wherein a shortest distance between the point where the second portion ends and an extension line of the third side ranges from 1% to 15% of the distance between the insertion side and the third side.

8. The memory card of claim 4, wherein the second portion has a segment within which the angle is constant.

9. The memory card of claim 1, wherein a notch portion is provided adjacent to the third side.

10. The memory card of claim 1, wherein a withdrawal assisting portion is provided adjacent to the third side and protruding from a reverse surface that is opposite a surface on which the plurality of second row terminals are provided.

11. The memory card of claim 10, further comprising a substrate, wherein a passive device is disposed on the substrate under the withdrawal assisting portion.

12. The memory card of claim 1, further comprising a substrate, wherein a passive device is disposed on the substrate between an extension line of the first portion of the first side and the second portion of the first side.

13. The memory card of claim 1, wherein the plurality of second row terminals include a reset terminal that is configured to receive a reset signal from a host, and wherein, in response to the reset signal, application of a second voltage to the second-voltage power supply terminal is interrupted and restarted.

14. The memory card of claim 1, wherein the plurality of first row terminals include a first ground terminal and a second ground terminal exposed adjacent to the first ground terminal, and wherein a distance between the first ground terminal and the insertion side is different than a distance between the second ground terminal and the insertion side.

15. The memory card of claim 14, wherein the first ground terminal and the second ground terminal are electrically and directly connected to each other,
wherein the first ground terminal is provided in a first position corresponding to a ground terminal of a first-type memory card, and wherein the second ground terminal is provided in a second position corresponding to a data terminal of the first-type memory card.

16. The memory card of claim 15, wherein the first ground terminal and the second ground terminal are integrated, and
a space between a portion exposed as the first ground terminal and a portion exposed as the second ground terminal is coated with an insulating material.

17. The memory card of claim 1, wherein an interface between the first portion and the second portion is disposed farther from the insertion side than centers of the plurality of second row terminals.

18. The memory card of claim 1, wherein as the second portion becomes far away from the first portion, the second portion sequentially has a front portion having a concave shape and a rear portion having a convex shape.

19. A memory card comprising:
a plurality of first row terminals arranged adjacent to an insertion side of the memory card and including a first power supply terminal having a first voltage; and
a plurality of second row terminals arranged farther apart from the insertion side than the plurality of first row terminals and including a second power supply terminal having a second voltage, wherein the plurality of first row terminals comprise a first ground terminal and a second ground terminal exposed adjacent to the first ground terminal, wherein the first ground terminal is positioned corresponding to a ground terminal of a UHS-1 memory card, and wherein the second ground terminal is positioned corresponding to a data terminal of the UHS-1 memory card, wherein the second ground terminal is configured to provide indication that the memory card is not the UHS-1 memory card, and wherein both the plurality of first row terminals and the plurality of second row terminals are configured to be electrically connected to a socket for operation.

20. An electronic system comprising:

a controller;

an input/output (I/O) unit configured to input or output data;

a memory unit configured to store data;

an interface unit configured to transmit and receive data to and from an external device; and a bus configured to connect the controller, the I/O unit, the memory unit, and the interface unit such that the controller, the I/O unit, the memory unit, and the interface unit communicate with one another, wherein the memory unit comprises the memory card of claim 1.

* * * * *